United States Patent
Thirumalai Ananthan Pillai et al.

(10) Patent No.: US 11,997,836 B1
(45) Date of Patent: May 28, 2024

(54) WIRELESS CHARGING PERFORMANCE IMPROVEMENTS

(71) Applicant: Apple Inc., Cupertino, CA (US)

(72) Inventors: Srinivasa V Thirumalai Ananthan Pillai, Santa Clara, CA (US); Timothy J Rasmussen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/053,946

(22) Filed: Nov. 9, 2022

Related U.S. Application Data (60) Provisional application No. 63/374,164, filed on Aug. 31, 2022.

(51) Int. Cl.
| | |
|---|---|
| *H05K 7/20* | (2006.01) |
| *H02J 7/00* | (2006.01) |
| *H02J 50/00* | (2016.01) |
| *H02J 50/10* | (2016.01) |

(52) U.S. Cl.
CPC .......... *H05K 7/2089* (2013.01); *H02J 7/0042* (2013.01); *H02J 7/007192* (2020.01); *H02J 50/005* (2020.01); *H02J 50/10* (2016.02)

(58) Field of Classification Search
CPC ...... H05K 7/2089; H02J 50/10; H02J 50/005; H02J 7/007192; H02J 7/0042
USPC .......................................................... 307/104
See application file for complete search history.

(56) References Cited

U.S. PATENT DOCUMENTS

| | | | |
|---|---|---|---|
| 9,157,765 B2 | 10/2015 | Chen et al. | |
| 2008/0164839 A1* | 7/2008 | Kato | H02J 7/04 320/108 |
| 2010/0139291 A1* | 6/2010 | Hofmeister | H10N 10/17 455/127.1 |
| 2018/0013311 A1* | 1/2018 | Provencher | H01M 10/6571 |
| 2018/0301790 A1* | 10/2018 | Kim | H01F 38/14 |

FOREIGN PATENT DOCUMENTS

| | | |
|---|---|---|
| AU | 2021201145 A1 | 3/2021 |
| CA | 2989165 A1 | 12/2016 |

OTHER PUBLICATIONS

Barbruni et al.; "Miniaturised Wireless Power Transfer Systems for Neurostimulation: A Review"; IEEE Transaction on biomedical circuits and systems, vol. 14, No. 6, Dec. 2020.
Kanoun et al.; "Energy-Aware System design for Autonomous Wireless Snesor Nodes: A Comprehensive Review"; Sensors (Basel). V. 21(2); Jan. 14, 2021.

* cited by examiner

*Primary Examiner* — Alfonso Perez Borroto
(74) *Attorney, Agent, or Firm* — FLETCHER YODER PC (57) ABSTRACT

An electronic device can include a wireless power transfer coil, an inverter having an input coupled to an input power source and an output coupled to the wireless power transfer coil, control circuitry that operates the inverter to deliver power from the input power source to a wireless power receiver coupled to the wireless power transfer coil, communication circuitry that allows communication with the wireless power receiver, and an auxiliary cooler and associated control circuitry that operates the auxiliary cooler, responsive to one or more temperature measurements, to transfer heat from the electronic device to an ambient environment.

22 Claims, 3 Drawing Sheets

WIRELESS CHARGING PERFORMANCE IMPROVEMENTS

CROSS-REFERENCE TO RELATED APPLICATIONS

This application claims priority to U.S. Provisional Application No. 63/374,164, filed Aug. 31, 2022, entitled "WIRELESS CHARGING PERFORMANCE IMPROVEMENTS," the disclosure of which is incorporated by reference in its entirety for all purposes.

BACKGROUND

In some applications, power delivery from a wireless power transfer system may be limited by thermal performance of the system, including the thermal properties and performance of the power transmitter and/or power receiver.

SUMMARY

Higher power delivery in a wireless power transfer system may, in some applications, be achieved by providing a wireless power transmitter that includes an auxiliary thermal system, such as thermoelectric transfer components. These components may be controlled responsive to one or more thermal measurements from the power transmitter, the power receiver, or both.

An electronic device can include a wireless power transfer coil, an inverter having an input coupled to an input power source and an output coupled to the wireless power transfer coil, control circuitry that operates the inverter to deliver power from the input power source to a wireless power receiver coupled to the wireless power transfer coil, communication circuitry that allows communication with the wireless power receiver, and an auxiliary cooler and associated control circuitry that operates the auxiliary cooler, responsive to one or more temperature measurements, to transfer heat from the wireless power transmitter to an ambient environment. The auxiliary cooler can be a thermoelectric cooler, and the control circuitry can operate the auxiliary cooler responsive to one or more temperature measurements by changing a voltage applied to the thermoelectric cooler responsive to the one or more temperature measurements.

The one or more temperature measurements can include one or more temperature measurements within the wireless power transmitter and/or one or more temperature measurements of the wireless power receiver. One or more signals corresponding to the one or more temperature measurements within the wireless power receiver can be received via the communication circuitry. The one or more temperature measurements of the wireless power receiver can include a system temperature. The one or more temperature measurements of the wireless power receiver can include a battery temperature. The one or more temperature measurements of the wireless power receiver can include a surface temperature.

The communication circuitry can include in-band communication circuitry that allows communication via modulation of power transmitted via the wireless power transmit coil or out-of-band communication circuitry that allows communication apart from the power transmitted via the wireless power transmit coil.

A wireless power transmitter can include a housing including a base portion and a portion that adapts the position or orientation of a wireless power receiver so that it is more readily viewed or interacted with by a user, a wireless power transmit coil, an inverter having an input coupled to an input power source and an output coupled to the wireless power transmit coil, control circuitry that operates the inverter to deliver power from the input power source to the wireless power receiver coupled to the wireless power transmit coil, communication circuitry that allows communication between the wireless power transmitter and the wireless power receiver, and an auxiliary cooler and associated control circuitry that operates the auxiliary cooler responsive to one or more temperature measurements to transfer heat from the wireless power transmitter to an ambient environment. The wireless power transmit coil and the auxiliary cooler can be located in the upright portion of the housing.

The auxiliary cooler can be a thermoelectric cooler, and the control circuitry can operate the auxiliary cooler responsive to one or more temperature measurements by changing a voltage applied to the thermoelectric cooler responsive to the one or more temperature measurements. The inverter, control circuitry, and communication circuitry can be disposed on one or more printed circuit boards, at least one of which can be located in the base portion of the housing. The wireless power transmitter can further include a radiating element and a thermal link that provides heat transfer between the auxiliary cooler and the radiating element. The radiating element can be within the base portion of the housing. The radiating element can be integral with the base portion of the housing. The thermal link can be a heat pipe that employs phase change of a coolant contained within the heat pipe to transfer heat from the auxiliary cooler to the radiating element. The thermal link can be a thermally conductive connecting rod or beam.

The one or more temperature measurements can include: one or more temperature measurements within the wireless power transmitter; or one or more temperature measurements within the wireless power receiver, wherein one or more signals corresponding to the one or more temperature measurements within the wireless power receiver are delivered via the communication circuitry. The one or more temperature measurements within the wireless power receiver can include at least one of a system temperature, a battery temperature, or a surface temperature.

The communication circuitry can include includes in-band communication circuitry that allows communication via modulation of power transmitted via the wireless power transmit coil.

A method of controlling a thermoelectric cooler in a wireless power transfer system including a wireless power transmitter and a wireless power receiver can include receiving one or more temperature measurements associated with the wireless power transfer system, the one or more temperature measurements including at least one of a wireless power transmitter temperature or a wireless power receiver temperature; and adjusting a voltage applied to the thermoelectric cooler responsive to the one or more received temperature measurements. The method can further include detecting, by the wireless power transmitter, the presence of a wireless power receiver; and communicating, by the wireless power transmitter, the availability of an auxiliary cooling system, so that the wireless power receiver can enter a high-performance mode in which the auxiliary cooling system absorbs excess heat generated by the high-performance mode.

DETAILED DESCRIPTION

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth to provide a thorough understanding of the implementations described herein. In other instances, methods, procedures, and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

Figure 1:
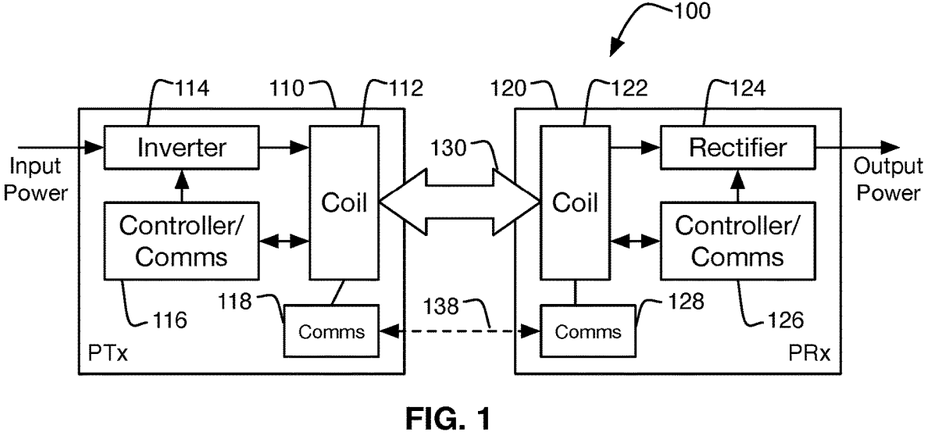
FIG. 1 illustrates a simplified block diagram of a wireless power transfer system.

FIG. 1 illustrates a simplified block diagram of a wireless power transfer system 100. Wireless power transfer system includes a power transmitter (PTx) 110 that transfers power to a power receiver (PRx) 120 wirelessly, such as via inductive coupling 130. Power transmitter 110 may receive input power that is converted to an AC voltage having particular voltage and frequency characteristics by an inverter 114. Inverter 114 may be controlled by a controller/communications module 116 that operates as further described below. In various embodiments, the inverter controller and communications module may be implemented in a common system, such as a system based on a microprocessor, microcontroller, or the like. In other embodiments, the inverter controller may be implemented by a separate controller module and communications module that have a means of communication between them. Inverter 114 may be constructed using any suitable circuit topology (e.g., full bridge, half bridge, etc.) and may be implemented using any suitable semiconductor switching device technology (e.g., MOSFETs, IGBTs, etc. made using silicon, silicon carbide, or gallium nitride devices).

Inverter 114 may deliver the generated AC voltage to a transmitter coil 112. In addition to a wireless coil allowing magnetic coupling to the receiver, the transmitter coil block 112 illustrated in FIG. 1 may include tuning circuitry, such as additional inductors and capacitors, that facilitate operation of the transmitter in different conditions, such as different degrees of magnetic coupling to the receiver, different operating frequencies, etc. The wireless coil itself may be constructed in a variety of different ways. In some embodiments, the wireless coil may be formed as a winding of wire around a suitable bobbin. In other embodiments, the wireless coil may be formed as traces on a printed circuit board. Other arrangements are also possible and may be used in conjunction with the various embodiments described herein. The wireless transmitter coil may also include a core of magnetically permeable material (e.g., ferrite) configured to affect the flux pattern of the coil in a way suitable to the particular application. The teachings herein may be applied in conjunction with any of a wide variety of transmitter coil arrangements appropriate to a given application.

PTx controller/communications module 116 may monitor the transmitter coil and use information derived therefrom to control the inverter 114 as appropriate for a given situation. For example, controller/communications module may be configured to cause inverter 114 to operate at a given frequency or output voltage depending on the particular application. In some embodiments, the controller/communications module may be configured to receive information from the PRx device and control inverter 114 accordingly. This information may be received via the power transmission coils (i.e., in-band communication) or may be received via a separate communications channel (not shown, i.e., out-of-band communication). For in-band communication, controller/communications module 116 may detect and decode signals imposed on the magnetic link (such as voltage, frequency, or load variations) by the PRx to receive information and may instruct the inverter to modulate the delivered power by manipulating various parameters of the generated voltage (such as voltage, frequency, etc.) to send information to the PRx. In some embodiments, controller/communications module may be configured to employ frequency shift keying (FSK) communications, in which the frequency of the inverter signal is modulated, to communicate data to the PRx. Controller/communications module 116 may be configured to detect amplitude shift keying (ASK) communications or load modulation-based communications from the PRx. In either case, the controller/communications module 126 may be configured to vary the current drawn on the receiver side to manipulate the waveform seen on the Tx coil to deliver information from the PRx to the PTx. For out-of-band communication, additional modules that allow for communication between the PTx and PRx may be provided, for example, WiFi, Bluetooth, or other radio links or any other suitable communications channel.

As mentioned above, controller/communications module 116 may be a single module, for example, provided on a single integrated circuit, or may be constructed from multiple modules/devices provided on different integrated circuits or a combination of integrated and discrete circuits having both analog and digital components. The teachings herein are not limited to any particular arrangement of the controller/communications circuitry.

PTx device 110 may optionally include other systems and components, such as a separate communications module 118. In some embodiments, comms module 118 may communicate with a corresponding module tag in the PRx via the power transfer coils. In other embodiments, comms module 118 may communicate with a corresponding module using a separate physical channel 138.

As noted above, wireless power transfer system also includes a wireless power receiver (PRx) 120. Wireless power receiver can include a receiver coil 122 that may be magnetically coupled 130 to the transmitter coil 112. As with transmitter coil 112 discussed above, receiver coil block 122 illustrated in FIG. 1 may include tuning circuitry, such as additional inductors and capacitors, that facilitate operation of the transmitter in different conditions, such as different degrees of magnetic coupling to the receiver, different operating frequencies, etc. The wireless coil itself may be constructed in a variety of different ways. In some embodiments, the wireless coil may be formed as a winding of wire around a suitable bobbin. In other embodiments, the wireless coil may be formed as traces on a printed circuit board. Other arrangements are also possible and may be used in conjunction with the various embodiments described herein. The wireless receiver coil may also include a core of magnetically permeable material (e.g., ferrite) configured to affect the flux pattern of the coil in a way suitable to the particular application. The teachings herein may be applied in conjunction with any of a wide variety of receiver coil arrangements appropriate to a given application.

Receiver coil 122 outputs an AC voltage induced therein by magnetic induction via transmitter coil 112. This output AC voltage may be provided to a rectifier 124 that provides a DC output power to one or more loads associated with the PRx device. Rectifier 124 may be controlled by a controller/communications module 126 that operates as further described below. In various embodiments, the rectifier controller and communications module may be implemented in a common system, such as a system based on a microprocessor, microcontroller, or the like. In other embodiments, the rectifier controller may be implemented by a separate controller module and communications module that have a means of communication between them. Rectifier 124 may be constructed using any suitable circuit topology (e.g., full bridge, half bridge, etc.) and may be implemented using any suitable semiconductor switching device technology (e.g., MOSFETs, IGBTs, etc. made using silicon, silicon carbide, or gallium nitride devices).

PRx controller/communications module 126 may monitor the receiver coil and use information derived therefrom to control the rectifier 124 as appropriate for a given situation. For example, controller/communications module may be configured to cause rectifier 124 to operate provide a given output voltage depending on the particular application. In some embodiments, the controller/communications module may be configured to send information to the PTx device to effectively control the power delivered to the receiver. This information may be received sent via the power transmission coils (i.e., in-band communication) or may be sent via a separate communications channel (not shown, i.e., out-of-band communication). For in-band communication, controller/communications module 126 may, for example, modulate load current or other electrical parameters of the received power to send information to the PTx. In some embodiments, controller/communications module 126 may be configured to detect and decode signals imposed on the magnetic link (such as voltage, frequency, or load variations) by the PTx to receive information from the PTx. In some embodiments, controller/communications module 126 may be configured to receive frequency shift keying (FSK) communications, in which the frequency of the inverter signal has been modulated to communicate data to the PRx. Controller/communications module 126 may be configured to generate amplitude shift keying (ASK) communications or load modulation-based communications from the PRx. In either case, the controller/communications module 126 may be configured to vary the current drawn on the receiver side to manipulate the waveform seen on the Tx coil to deliver information from the PRx to the PTx. For out-of-band communication, additional modules that allow for communication between the PTx and PRx may be provided, for example, WiFi, Bluetooth, or other radio links or any other suitable communications channel.

As mentioned above, controller/communications module 126 may be a single module, for example, provided on a single integrated circuit, or may be constructed from multiple modules/devices provided on different integrated circuits or a combination of integrated and discrete circuits having both analog and digital components. The teachings herein are not limited to any particular arrangement of the controller/communications circuitry. PRx device 120 may optionally include other systems and components, such as a communications ("comms") module 128. In some embodiments, comms module 128 may communicate with a corresponding module in the PTx via the power transfer coils. In other embodiments, comms module 128 may communicate with a corresponding module or tag using a separate physical channel 138.

Numerous variations and enhancements of the above-described wireless power transmission system 100 are possible, and the following teachings are applicable to any of such variations and enhancements.

Figure 2A:
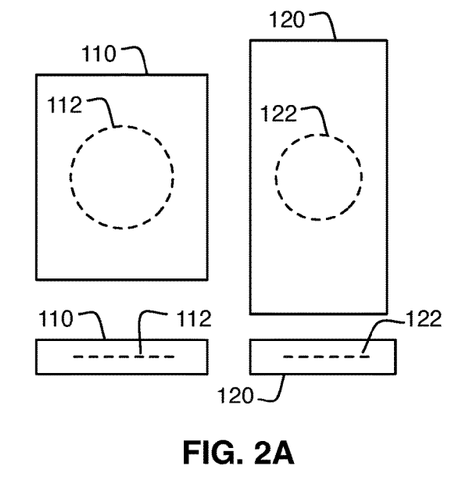
FIGS. 2A-2C illustrate a simplified physical configuration of a wireless power transfer system.
Figure 2B:
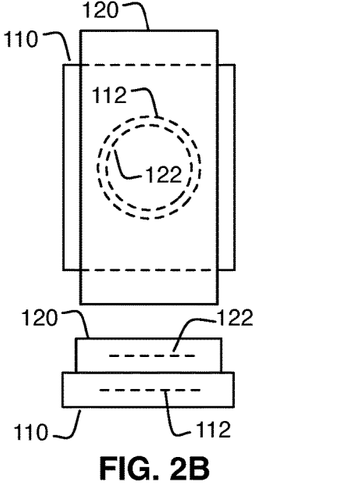

FIG. 2A illustrates a simplified diagram of a PTx (110)-PRx (120) system. Both devices are illustrated in plan view (upper part of the diagram) and an edge-on section view (lower part of the diagram). PTx device 110 includes transmitter coil 112, and PRx device 120 includes a receiver coil 122. In some embodiments, PTx device 110 may be a wireless charging pad, mat, or stand (or other wireless power transfer device), and PRx device 120 may be a mobile phone, tablet computer, smart watch, (or other wireless power receiver device). Although the respective devices are depicted as generally rectangular in shape with generally circular charging coils, it is to be appreciated that other configurations are also possible. FIG. 2B illustrates the PTx 110 and PRx 120 as aligned for charging. In FIG. 2B, the devices are horizontally aligned (as depicted in the plan view) and vertically aligned and in close proximity (as illustrated in the sectional view). In this context, horizontal and vertical are merely used as terms of convenience, and the true orientation of the system may vary. The following description is applicable to a system in any such orientation, although "horizontal" and "vertical" will continue to be used for contextual clarity.

Figure 2C:
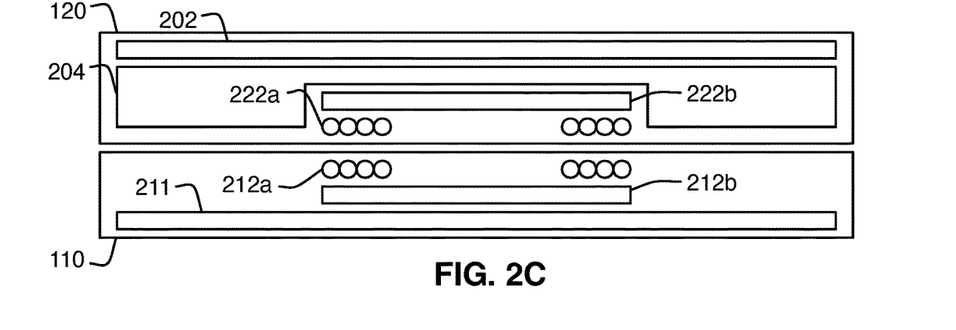

FIG. 2C illustrates an expanded side/cross-sectional view of a wireless power transmitter/PTx 110 and wireless power receiver/PRx 120 highlighting additional internal components. Beginning with PTx 110, this device may include one or more printed circuit boards 211 that house the electronic components making up the systems described above with respect to FIG. 1. These systems include, without limitation, the inverter 114, controller and communications module 116, and an optional additional/out-of-band communications module 118. Printed circuit board(s) 211 may also include other electronic components for a given application. In some applications, printed circuit board(s) 211 may also include printed circuit traces forming power transmit coil 112. In other cases, and as illustrated, a power transmit coil may be provided that includes windings 212a and optionally a magnetic core 212b. Windings 212a may be made up of one or more turns of conductive wire, for example Litz wire. Windings 212a may be disposed in a single layer (as shown) or may be formed in multiple layers. Windings may be generally circular in cross section (as depicted in FIGS. 2A-2B) or may be polygonal or have any other shape deemed appropriate for a given application. Magnetic core 212b may be used to shield electronic components on printed circuit board(s) 211 from electric, magnetic, or electromagnetic fields associated with current flowing in windings 212a. Magnetic core 212b may also be shaped so as to provide a desired degree of flux "steering" that improves coupling between PTx 110 and PRx 120. The configuration illustrated in FIG. 2C may be somewhat "simplified" as compared to the construction of any particular PTx device and is provided here as a high-level depiction of certain system components and not necessarily as a detailed design configuration.

Continuing with PRx 120, this device may include one or more printed circuit boards 202 that house the electronic components making up the systems described above with respect to FIG. 1. These systems include, without limitation, rectifier 124, controller and communications module 126, and an optional additional/out-of-band communications module 128. Printed circuit board(s) 202 may also include other electronic components for a given application. For example, printed circuit board(s) 202 can house the processing, storage, input/output, and display systems of an electronic device such as a mobile phone, tablet computer, etc. PRx 120 may also include a battery 204 that can be charged by the wireless power transfer system. Battery 204 may be rechargeable cell or cells implemented using lithium ion, LiFePO4, or other suitable battery chemistry. As depicted in FIG. 2C, battery 204 may, but need not, occupy a substantial portion of the internal volume of PRx 120, and it may be physically configured so as to partially surround other components to provide maximal use of the interior volume of PRx 120.

As with PTx 110, in some PRx applications, printed circuit board(s) 202 may also include printed circuit traces forming power receive coil 122. In other cases, and as illustrated, a power transmit coil may be provided that includes windings 222a and optionally a magnetic core 222b. Windings 222a may be made up of one or more turns of conductive wire, for example Litz wire. Windings 222a may be disposed in a single layer (as shown) or may be formed in multiple layers. Windings may be generally circular in cross section (as depicted in FIGS. 2A-2B) or may be polygonal or have any other shape deemed appropriate for a given application. Magnetic core 222b may be used to shield electronic components on printed circuit board(s) 202 from electric, magnetic, or electromagnetic fields associated with current flowing in windings 222a. Magnetic core 222b may also be shaped so as to provide a desired degree of flux "steering" that improves coupling between PTx 110 and PRx 120. The configuration illustrated in FIG. 2C may be somewhat "simplified" as compared to the construction of any particular PRx device and is provided here as a high-level depiction of certain system components and not necessarily as a detailed design configuration.

Figure 3:
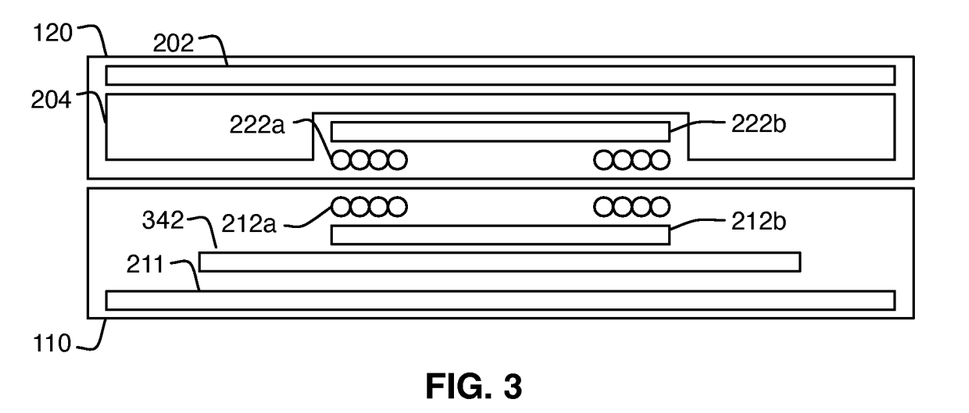
FIG. 3 illustrates a simplified physical configuration of a wireless power transfer system including a wireless power transmitter with a thermoelectric cooling device.

FIG. 3 illustrates an expanded side/cross-sectional view of a wireless power transmitter/PTx 110 and wireless power receiver/PRx 120 in which PTx 110 includes an active auxiliary cooling device. The auxiliary cooling device may take a variety of forms. In one embodiment, auxiliary cooling device may be a thermoelectric cooler 342, in which a voltage applied to a junction of dissimilar metals causes the transfer of heat from one side of the device (the "cold side") to the other side (the "hot side"). Such devices are also known as Peltier coolers, after the Peltier effect that explains their operation. As described in greater detail below, thermoelectric cooler 342 may be selectively controlled by PTx 110 (optionally in cooperation with PRx 120) to remove heat associated with operation of the wireless power transfer system, the charging of battery 204, and/or operation of PRx device 120, which can allow for higher power transfer and/or charging rates, improved operating efficiency or capability, and other benefits.

In the high-level diagram of FIG. 3, thermoelectric cooler 342 is located beneath or behind the wireless power transmit coil made up of windings 212a and core 212b. From a heat transfer perspective, it could be preferable to position thermoelectric cooler 342 directly adjacent PRx device 120, and particularly adjacent heat generating components including the wireless power transfer system and the battery. However, as a practical matter, the conductive nature of thermoelectric cooler 342 might thereby interfere with operation of the wireless power transfer system by acting as "friendly metal." In some cases, it may be possible to construct an auxiliary cooling device 342 that reduces these effects. However, because both windings 212a and magnetic core 212b are typically formed of materials that are thermally conductive, a sufficient degree of heat transfer may still be accomplished to achieve the desired objectives. Additionally, although printed circuit board(s) 211 are shown between the thermoelectric cooler 342 and the housing of PTx 110, it is to be understood that a suitable configuration that allows the "hot side" of the cooler to radiate or otherwise transfer its heat out of the housing of PTx 110 without passing through printed circuit board(s) 211 or the components thereon. One example of such an arrangement is discussed in greater detail below with respect to FIG. 5; however, numerous such configurations are possible depending on the physical configuration of a given system. These configurations can include aspects relating to placement, sizing, and materials of the various system components. For example, it may be desirable for all or portions of the housings of PTx 110 and PRx 120 to be made from thermally conductive but electrically insulating materials that allow for the desired degree of heat transfer without interfering with the electromagnetic fields associated with the wireless power transfer operation. As one example, certain ceramic materials can have the desired thermal conductivity while not being electrically conductive.

Figure 4:
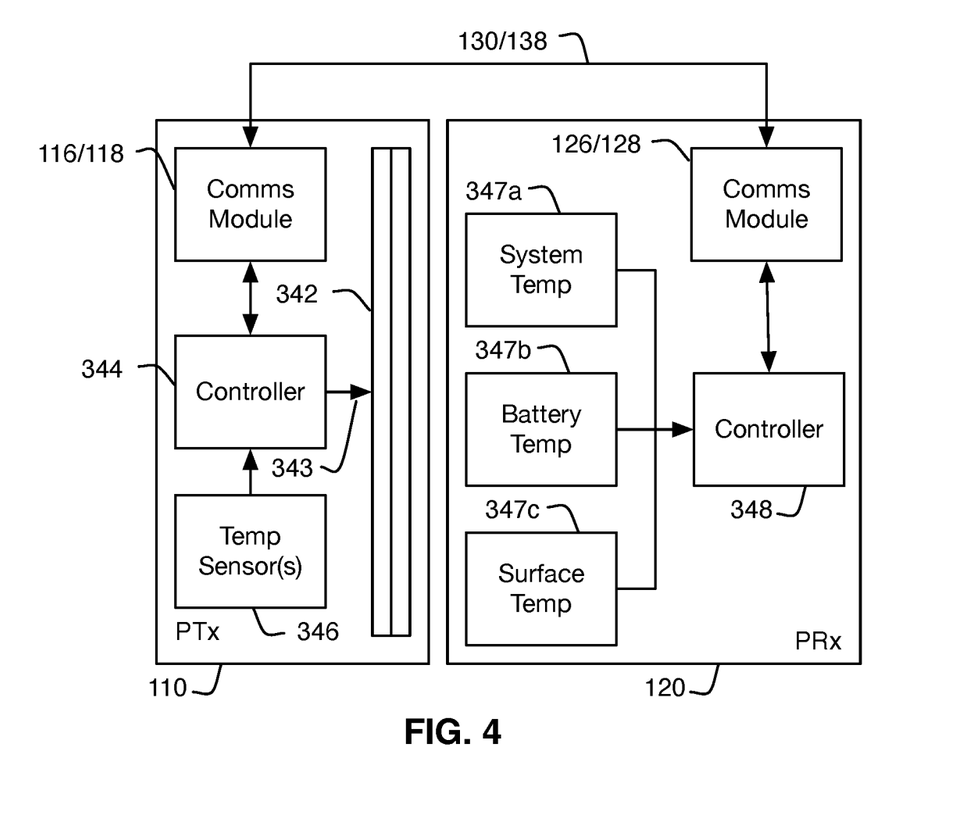
FIG. 4 illustrates a block diagram of a thermal control system for a wireless power transfer system.

FIG. 4 is a block diagram illustrating the operating configuration(s) of the auxiliary cooling system. At a minimum, PTx 110 can include thermoelectric cooler 342, one or more temperature sensor(s) 346, and a controller 344. Controller 344 can be implemented as part of the PTx comms/control module 116, or can be a separate component, and can include any suitable combination of analog, digital, and/or programmable circuitry. Such circuitry could, for example, include an analog control loop, a finite state machine, a programmable controller or microcontroller, etc. Controller 344 can be responsive to a temperature measured by temperature sensor(s) 346 and can control or regulate a voltage 343 applied to thermoelectric cooler 342 to keep the sensed temperature at a desired value/in a desired range. In one case, temperature sensor(s) 346 can be a single temperature sensor measuring a temperature associated with PTx 110, for example a temperature that is affected by the amount of power transferred and/or the efficiency with which it is being transferred. In other cases, there could be multiple sensors measuring various temperatures associated with PTx 110, and such temperatures could in some or all cases be affected by parameters other than those directly related to wireless power transfer.

In some applications or embodiments, controller 344 may additionally or alternatively be responsive to one or more temperatures associated with PRx 120. For example, as illustrated in FIG. 4, PRx 120 may include three temperature sensors, a system temperature sensor 347a, a battery temperature 347b, and a surface temperature 347c. These three temperature sensors are exemplary only, and more, fewer, and/or different temperature sensors could be provided in a particular application. However, the three illustrated sensors correspond to three temperatures in PRx 120 that it may be desirable to control or regulate using the auxiliary cooling system.

More specifically, system temperature 347a may be driven by thermal energy associated with operation of the electronic device itself. For example, during times of high processing load, a processor of an electronic device may cause higher device temperatures. The auxiliary cooling system described above being responsive to such temperatures and being configured to pull more heat from the device (e.g., by controlled operation of thermoelectric cooler 342) can thus allow for longer sustained period of higher device loads. This can provide for improved user experience, as the device can maintain higher performance for longer periods of time while positioned on the wireless power transfer charger, even beyond the time period during which the battery is charging.

Battery temperature sensor 347b may be associated with heat generated in the battery as a result of the charging operation. In general, higher battery charging rates and/or longer periods of battery charging will result in higher battery temperatures. Additionally, continued charging of a battery beyond certain temperatures can reduce battery performance. To that end, the auxiliary cooling system may be made responsive, at least in part, to a measured battery temperature. This can allow the cooling system performance to be increased to lower the battery temperature, allowing for sustained higher rate charging. These improvements provide for improved user experience, as the battery can be charged more quickly while also preserving its life.

Surface temperature sensor 347c may be associated with a heat level on the exterior of a case of PRx 120, such as a temperature that might be experienced by a user holding or wearing the device. The heat associated with this temperature may be a "hot spot" associated with the particular location of one or more thermal energy dissipating components, and it may be desirable to regulate the externally perceived temperatures associated with these heat sources to provide increased user comfort. To that end, the auxiliary cooling system may be made responsive, at least in part, to a measured surface temperature (or temperature corresponding to a surface temperature). This can allow the cooling system performance to be increased to lower the surface temperature, allowing for greater user comfort, thereby improving the user experience.

To facilitate auxiliary cooling control in PTx 110 that is responsive to one or more temperatures measured in PRx 120, some communication of the PRx temperatures to the PTx may be provided. As one example, temperatures from the sensors 347a, 347b, and/or 347c may be provided to a controller 348 in PRx 120. Controller 348 can be implemented as part of the PRx comms/control module 126, or can be a separate component, and can include any suitable combination of analog, digital, and/or programmable circuitry. In some cases, controller 348 can simply pass the measured temperatures on to controller 344 via a communications link, such as in-band communications link 130 or out of band communications link 138 as discussed above with respect to FIG. 1. To that end, the signal(s) may also be processed by either in-band controller/communications modules 116 and 126 or by out of band communications modules 118 and 128. In some applications, controller 348 can perform some degree of processing on the measured temperatures and provide to controller 344 a control signal related to or derived from the measured temperatures, but not necessarily equivalent or analogous to the measured temperatures. In any case, the net result of such a system is that controller 344 adjusts the voltage 343 supplied to thermoelectric cooler 342 to pull more heat from the system, thereby reducing the measured temperature(s) and allowing for improved operation and user experience.

Additionally, PTx 110 could include an additional sensor that allows PTx 110 to detect that a PRx 120 has been brought in proximity. This could include position sensors, such as capacitive proximity sensors, magnets and appropriate sensors (such as Hall-effect sensors), or other suitable sensing technology. Alternatively, the PTx circuitry could use either the in-band or out-of-band communications modules (and the associated communications received) of the wireless power transfer system itself to detect a PRx device. PTx thermal system controller 344 could be configured to communicate to PRx device 120 (via either in-band or out-of-band comms) that PTx is equipped with an auxiliary cooling system. PRx 120 could then use this information to infer that it can operate in a high-performance mode that generates more heat, because PTx device can sink the excess heat so generated. In some embodiments, these high-performance modes could include media playback, augmented reality functionality, gaming, etc.

Figure 5:
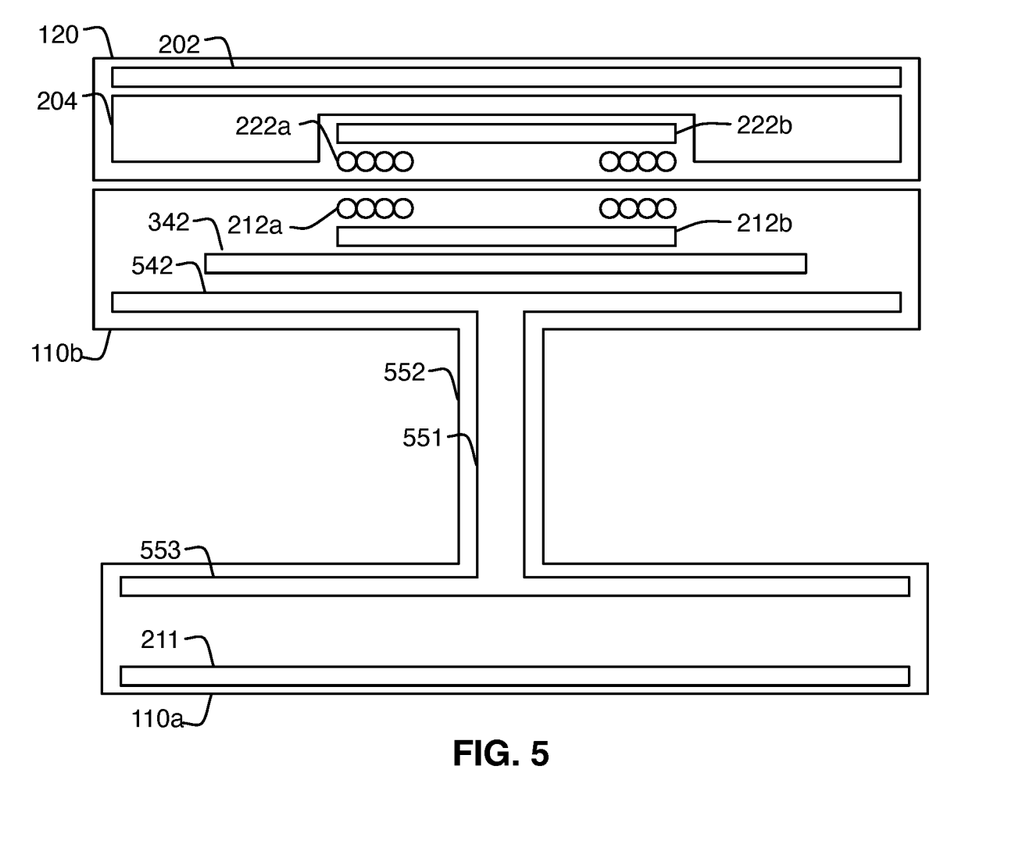
FIG. 5 illustrates a wireless power transfer system with thermal cooling.

FIG. 5 illustrates an exemplary physical configuration of a wireless power transfer system including a PTx 110 with an auxiliary cooling system. The illustrated physical configuration can be a stand that may position a PRx 120 in a position that it is more readily viewed or interacted with by a user by adapting the position or orientation of PRx 120. To that end, PTx 110 can include one or more features for maintaining PRx 120 in the desired position. These can include physical configuration features, such as surfaces that receive PRx 120 and allow it to be retained in the desired position. Additionally or alternatively, this can include securing features such as magnets that can cooperate with complementary magnets in PRx 120 to secure PRx 120 in the desired position. Other positioning and securing arrangements are also possible, such as the use of gripping or securing materials, additional or alternative retaining features such as shelves or ledges, gripping arms, etc.

An upper portion 110b of PTx 110 that is adjacent PRx 120 can include a thermoelectric cooler 542 as described above. In some embodiments, thermoelectric cooler can be in thermal communication with a radiating element 553 that can be disposed in another part of PTx 110, such as PTx base 110a. The thermal communication can be provided by a thermal link 551. Thermal link 551 may be a thermally conductive material, such as a connecting rod or beam made of a suitable thermal conductive material, such as copper, aluminum, graphite, etc. In some applications thermal link 551 may be a heat pipe that relies on phase change of a coolant contained within the heat pipe to transfer heat from the hot side of thermoelectric cooler 542 to the radiating element 553. The thermal link can be contained within a portion 552 of the housing of PTx 110, or it can be exterior to such housing. Either portion 552 and/or thermal link 551 can, but need not, provide support to all or a portion of upright portion 110b of the housing of PTx 110b.

Radiating element 553 can be contained within a housing of PTx 110 or can form all or part of an exterior portion of the housing. For example, the base portion of PTx 110 could be formed of a thermally conductive material (and optionally but not necessarily a material with a relatively high thermal mass) that radiates heat from the wireless power transfer system and other systems of PRx 120 into the ambient environment. In other cases, radiating element 553 could also be located within a housing of the PTx device with suitable vents, windows, and/or housing materials to allow for heat transfer to the environment. Additionally, although radiating element 553 is described as "radiating" heat to the ambient environment, other heat transfer modes, including without limitation convection, conduction, and/or forced air circulation could also be employed. The "transfer" of heat to the ambient environment should be interpreted as including any or all of these or other heat transfer modes.

In the above-described wireless power transmitter stand, the wireless power transfer coil can be disposed within upright portion 110b. The printed circuit board(s) 211 containing the various electronic components of the wireless power transmitter, such as the inverter, controller/control circuitry, communications module/circuitry, etc. can be located either in the raised portion 110b or in the base portion 110a as desired for a particular embodiment. The auxiliary cooler, e.g., thermoelectric cooler 542 can be in upright portion 110b. Radiating surface 553 may be disposed in the base portion 110a (as shown), or could be in the upright portion 110b, or could be omitted entirely (similar to the configuration of FIG. 3). Similarly, thermal link 551 may be included and configured as necessary for any of such embodiments, including its omission for configuration in which the auxiliary cooler is configured to discharge heat out the "back" of raised portion 110b.

Described above are various features and embodiments relating to auxiliary cooling of a wireless power transfer system and PTx and PRx devices associated therewith. Such arrangements may be used in a variety of applications but may be particularly advantageous when used in conjunction with electronic devices such as mobile phones, tablet computers, laptop or notebook computers, and accessories, such as wireless headphones, styluses, etc. Additionally, although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The foregoing describes exemplary embodiments of wireless power transfer systems that may be able to transmit certain information amongst the PTx and PRx in the system, such as device temperature information. The present disclosure contemplates this passage of information improves the devices' ability to provide wireless power signals to each other in an efficient manner to facilitate battery charging.

Entities implementing the present technology should take care to ensure that, to the extent any sensitive information is used in particular implementations, that well-established privacy policies and/or privacy practices are complied with. Such entities would be expected to implement and consistently apply privacy practices that are generally recognized as meeting or exceeding industry or governmental requirements for maintaining the privacy of users. Implementers should inform users where personally identifiable information is expected to be transmitted in a wireless power transfer system and allow users to "opt in" or "opt out" of participation. For instance, such information may be presented to the user when they place a device onto a power transmitter, if the power transmitter is configured to poll for temperature or other wireless charging parameters from the power receiver.

Risk can be minimized by limiting the collection of data and deleting data once it is no longer needed. In addition, and when applicable, data de-identification can be used to protect a user's privacy. For example, a device identifier may be partially masked to convey the power characteristics of the device without uniquely identifying the device. De-identification may be facilitated, when appropriate, by removing identifiers, controlling the amount or specificity of data stored (e.g., collecting location data at city level rather than at an address level), controlling how data is stored (e.g., aggregating data across users), and/or other methods such as differential privacy. Robust encryption may also be utilized to reduce the likelihood that communication between inductively coupled devices are spoofed.

The invention claimed is:

1. An electronic device comprising:
a wireless power transfer coil;
an inverter having an input coupled to an input power source and an output coupled to the wireless power transfer coil;
control circuitry that operates the inverter to deliver power from the input power source to a wireless power receiver coupled to the wireless power transfer coil;
communication circuitry that allows communication with the wireless power receiver; and
an auxiliary cooler and associated control circuitry that operates the auxiliary cooler, responsive to one or more temperature measurements, to transfer heat from the wireless power transfer coil to an ambient environment.

2. The electronic device of claim 1 wherein the auxiliary cooler is a thermoelectric cooler, and the control circuitry operates the auxiliary cooler responsive to one or more temperature measurements by changing a voltage applied to the thermoelectric cooler responsive to the one or more temperature measurements.

3. The electronic device of claim 1 wherein the one or more temperature measurements include one or more temperature measurements within the electronic device.

4. The electronic device of claim 1 wherein the one or more temperature measurements include one or more temperature measurements of the wireless power receiver, wherein one or more signals corresponding to the one or more temperature measurements within the wireless power receiver are received via the communication circuitry.

5. The electronic device of claim 4 wherein the one or more temperature measurements of the wireless power receiver include a system temperature.

6. The electronic device of claim 4 wherein the one or more temperature measurements of the wireless power receiver include a battery temperature.

7. The electronic device of claim 4 wherein the one or more temperature measurements of the wireless power receiver include a surface temperature.

8. The electronic device of claim 4 wherein the communication circuitry includes in-band communication circuitry that allows communication via modulation of power transmitted via the wireless power transfer coil.

9. The electronic device of claim 4 wherein the communication circuitry includes out-of-band communication circuitry that allows communication apart from the power transmitted via the wireless power transfer coil.

10. A wireless power transmitter comprising:
a housing including a base portion and a portion that adapts a position or orientation of a wireless power receiver so that it is more readily viewed or interacted with by a user;
a wireless power transmit coil;
an inverter having an input coupled to an input power source and an output coupled to the wireless power transmit coil;
control circuitry that operates the inverter to deliver power from the input power source to the wireless power receiver coupled to the wireless power transmit coil;
communication circuitry that allows communication between the wireless power transmitter and the wireless power receiver; and
an auxiliary cooler and associated control circuitry that operates the auxiliary cooler responsive to one or more temperature measurements to transfer heat from the wireless power transmitter to an ambient environment;
wherein at least the wireless power transmit coil and the auxiliary cooler are located in the upright portion of the housing.

11. The wireless power transmitter of claim 10 wherein the auxiliary cooler is a thermoelectric cooler, and the control circuitry operates the auxiliary cooler responsive to one or more temperature measurements by changing a voltage applied to the thermoelectric cooler responsive to the one or more temperature measurements.

12. The wireless power transmitter of claim 10 wherein the inverter, control circuitry, and communication circuitry are disposed on one or more printed circuit boards, at least one of which is located in the base portion of the housing.

13. The wireless power transmitter of claim 10 further comprising a radiating element and a thermal link that provides heat transfer between the auxiliary cooler and the radiating element.

14. The wireless power transmitter of claim 13 wherein the radiating element is within the base portion of the housing.

15. The wireless power transmitter of claim 13 wherein the radiating element is integral with the base portion of the housing.

16. The wireless power transmitter of claim 13 wherein the thermal link is a heat pipe that employs phase change of a coolant contained within the heat pipe to transfer heat from the auxiliary cooler to the radiating element.

17. The wireless power transmitter of claim 13 wherein the thermal link is a thermally conductive connecting rod or beam.

18. The wireless power transmitter of claim 10 wherein the one or more temperature measurements include:
one or more temperature measurements within the wireless power transmitter; or
one or more temperature measurements within the wireless power receiver, wherein one or more signals corresponding to the one or more temperature measurements within the wireless power receiver are delivered via the communication circuitry.

19. The wireless power transmitter of claim 18 wherein the one or more temperature measurements within the wireless power receiver include at least one of:
a system temperature;
a battery temperature; or
a surface temperature.

20. The wireless power transmitter of claim 18 wherein the communication circuitry includes in-band communication circuitry that allows communication via modulation of power transmitted via the wireless power transmit coil.

21. A method of controlling a thermoelectric cooler in a wireless power transfer system including a wireless power transmitter and a wireless power receiver, the method comprising:
receiving one or more temperature measurements associated with the wireless power transfer system, the one or more temperature measurements including at least one of a wireless power transmitter temperature or a wireless power receiver temperature; and
adjusting a voltage applied to the thermoelectric cooler responsive to the one or more received temperature measurements.

22. The method of claim 21 further comprising:
detecting, by the wireless power transmitter, the presence of the wireless power receiver; and
communicating, by the wireless power transmitter, the availability of an auxiliary cooling system, so that the wireless power receiver can enter a high-performance mode in which the auxiliary cooling system absorbs excess heat generated by the high-performance mode.

\* \* \* \* \*